US006905957B2

(12) United States Patent
Kakita

(10) Patent No.: US 6,905,957 B2
(45) Date of Patent: Jun. 14, 2005

(54) POLISHING METHOD AND POLISHING APPARATUS PERMITTING CONTROL OF POLISHING TIME AT A HIGH ACCURACY

(75) Inventor: Shinichiro Kakita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/273,883

(22) Filed: Oct. 18, 2002

(65) Prior Publication Data

US 2003/0077904 A1 Apr. 24, 2003

(30) Foreign Application Priority Data

Oct. 19, 2001 (JP) ....................................... 2001-321534

(51) Int. Cl.[7] ........................................... H01L 21/4763

(52) U.S. Cl. ....................... 438/631; 438/633; 438/645; 438/692

(58) Field of Search ................................ 438/633, 631, 438/645, 692

(56) References Cited

U.S. PATENT DOCUMENTS

| | | | |
|---|---|---|---|
| 5,609,511 A | 3/1997 | Moriyama et al. | 451/5 |
| 6,113,465 A | 9/2000 | Kim et al. | 451/41 |
| 6,290,572 B1 * | 9/2001 | Hofmann | 451/5 |
| 6,517,412 B2 * | 2/2003 | Lee et al. | 451/5 |

FOREIGN PATENT DOCUMENTS

| | | |
|---|---|---|
| EP | 0623423 A1 | 11/1994 |
| EP | 0806266 A2 | 11/1997 |
| GB | 2298960 A | 9/1996 |
| JP | 8-17768 | 1/1996 |
| JP | 10-98016 | 4/1998 |
| JP | 10-106984 | 4/1998 |
| JP | 3077656 | 6/2000 |

OTHER PUBLICATIONS

Liu, et al., "Utilization of Optical Metrology as an In–Line Characterization Technique for Process Performance Improvement and Yield Enhancement of Dielectric and Metal CMP in IC Manufacturing" (Proc. SPIE—Int. Soc. Opt. Eng. (USA), 1999, vol. 3743, pp. 102–111) (Abstract).

* cited by examiner

*Primary Examiner*—Hsien-Ming Lee
(74) *Attorney, Agent, or Firm*—Scully, Scott, Murphy & Presser

(57) ABSTRACT

A preceding wafer having an aluminum wiring and a silicon oxide film formed on an insulating film is chemico-mechanically polished. In the stage in which surface irregularities of the silicon oxide film are eliminated, polishing is discontinued. On the basis of the result, a polishing time is determined in accordance with the following formula:

$$T=(D1-D2)/v+t1$$

where, D1 represents the thickness in the stage in which polishing is discontinued; D2, a target thickness; t1, a time required from the initial thickness to reach the thickness D1; and the polishing rate of the material of the silicon oxide film formed on a flat substrate is denoted as v.

4 Claims, 12 Drawing Sheets a
$D_0$
h
1
2
3
$D_2$

EXISTING ART

EXISTING ART

EXISTING ART

POLISHING METHOD AND POLISHING APPARATUS PERMITTING CONTROL OF POLISHING TIME AT A HIGH ACCURACY

BACKGROUND OF THE INVENTION

The present invention relates to a technique of chemico-mechanically polishing a film formed on a wafer with a high thickness controllability until a prescribed thickness is reached.

Along with the recent tendency of scaledown of semiconductor devices, importance is placed on the technique for flattening the wafer surface more than ever. Among others, chemical-mechanical polishing (hereinafter referred to from time to time as "CMP") is excellent in productivity, has many other advantages, and occupies a particularly important position among the flattening techniques. In the CMP process, it is important to accurately set conditions for obtaining a target thickness, particularly, a polishing time.

Japanese Patent Publication No. 3077656 discloses a recipe correcting method of a semiconductor device, which permits improvement of the process treatment ability without causing a change in the amount of polishing even upon a change in the polishing rate, and eliminating the necessity of re-polishing. The method disclosed in the Publication comprises the steps of monitoring the polishing rate of a semiconductor manufacturing apparatus performing chemico-mechanical polishing, calculating a polishing time from the thus monitored polishing rate and required amount of polishing, selecting process recipe information based on the calculated polishing time from a process recipe selection table as a recipe change portion, and adding the thus selected recipe change portion to a predetermined recipe fixed portion, thereby correcting the recipe information.

Methods for determining the polishing time and polishing conditions for the subsequent runs on the basis of data regarding the polishing time and the amount of polishing upon chemico-mechanically polishing a wafer are disclosed in some other patent publications.

Japanese Unexamined Patent Publication No. 10-106984 discloses a method of calculating an optimum polishing time from the polishing time, the target thickness value, and the thickness before and after polishing, and applying the thus calculated optimum polishing time to the subsequent runs of polishing. Japanese Unexamined Patent Application Publication No. 10-98016 discloses a method of detecting the status of polishing through measurement of thickness after polishing and controlling the polishing conditions from the thus measured result and a reference thickness.

Japanese Unexamined Patent Application Publication No. 8-17768 discloses a method of measuring thickness after polishing of a stepped wafer, and setting a polishing time for the next run.

In a method of determining a polishing time and polishing conditions for the subsequent runs on the basis of data regarding the polishing time and the amount of polishing as in the existing art as described above, however, determination of a optimum polishing time giving a target thickness usually requires several batches. The reason has not as yet been clarified. The present inventor therefore carried out many experiments, and clarified that the reason was the occurrence of surface irregularities on the surface of a film to be polished.

With the progress of CMP, as described above, the silicon oxide film 3 to be polished changes in shape, and the polishing rate varies with this change in condition. In the existing method of determining the polishing time, it is not taken into account that the condition of the object to be polished in response to the polishing process, and the polishing rate varies accordingly, or more specifically, that the polishing rate becomes higher in the former half of polishing because of the irregularities in shape. According to the existing method, therefore, a calculated value of polishing time tends to be shorter than the actual time. The difference between the thickness obtained upon polishing with a calculated polishing time and the target thickness is reduced by repeating batches and accumulating polishing data, and a thickness set as a target can finally be achieved. Before achieving this state, however, a number of batches are necessary. As a result, a large quantity of wafers requiring re-polishing is produced, and there occur rejectable wafers not finished into products, and a decrease in yield.

SUMMARY OF THE INVENTION

In view of the above-mentioned circumstances, an object of the present invention is therefore to highly accurately control the polishing time of chemico-mechanically polishing so as to achieve a target thickness, inhibit occurrence of rejects and wafers requiring re-polishing, and thus improve the yield.

The present invention provides a polishing method of chemico-mechanically polishing a film formed on the surface of wafer having surface irregularities to a target thickness, comprising the steps of determining a predicted required time for the former half of polishing by use of polishing data acquired upon polishing the preceding wafer of a type similar to that of the wafer to be polished; determining a predicted required time for the latter half of polishing by use of a polishing rate of the component materials of said film formed on a flat substrate; using a value obtained by summing up these predicted required times; and chemico-mechanically polishing a wafer to be polished.

The present invention provides also a polishing method of chemico-mechanically polishing a film formed on the surface of a wafer having surface irregularities to a target thickness, comprising a step of acquiring a polishing rate v of component materials of the film formed on a flat substrate; a step of chemico-mechanically polishing a preceding wafer of the same type as the wafer to be polished, discontinuing polishing in a stage prior to reaching the target thickness, and measuring the film thickness in this stage; a step of calculating T as defined by the following formula (I):

$$T=(D1-D2)/v+t1 \quad \text{(I)}$$

where, D1 represents the film thickness upon discontinuing polishing; D2 represents the target film thickness; and t1 represents the time required from the initial thickness to the thickness D1; and a step of chemico-mechanically polishing the wafer to be polished, using a value obtained with reference to T as the polishing time.

The present invention provides a polishing apparatus for chemico-mechanically polishing a film formed on the surface of a wafer having surface irregularities to a target thickness, comprising a storage unit which stores polishing data acquired for a preceding wafer of the same type as the wafer to be polished and a polishing rate of component elements of the film formed on a flat substrate; a polishing time managing unit which determines a predicted required time for a former half by using the polishing data read out from the storage unit, determining a predicted required time for the latter half by using the polishing rate read out from the storage unit, and obtaining a polishing time by summing up these predicted required time; and a polishing unit which chemico-mechanically polishes the wafer for the polishing time obtained by the polishing time managing unit.

The present invention provides also a polishing apparatus for chemico-mechanically polishing a film formed on the surface of a wafer having surface irregularities to a target thickness, comprising a polishing unit which chemico-mechanically polishes a wafer; a thickness control unit which controls the thickness of a film provided on the surface of the wafer; a thickness measuring unit which measures the thickness of the film provided on the surface of the wafer; and a storage unit which stores data regarding polishing conditions; wherein, when polishing of a preceding wafer arranged in the polishing unit is started, the thickness control unit requests the polishing unit to discontinue polishing before reaching a target thickness D2; the thickness measuring unit measures the thickness D1 of the film in a stage in which discontinuance of polishing is requested, and stores the thickness D1 and a polishing time t1 required before reaching the thickness D1; the polishing time managing unit reads out a polishing rate v of the material of the film formed on a flat substrate, the thickness D1 and the polishing time t1 required before reaching the thickness D1, stored previously in the storage unit from the storage unit, calculates a value of T defined by the following formula (I):

$$T=(D1-D2)/v+t1 \tag{I}$$

where, D1 represents the thickness in the stage in which polishing is discontinued; D2, a target thickness; and t1, a time required before reaching the thickness D1 from the initial thickness, determines a polishing time of the wafer from this value, and stores the same in the storage unit; the polishing unit reads out, when a wafer to be polished is arranged on the polishing unit, the polishing time stored in the storage unit, and chemico-mechanically polish the wafer to be polished for the read-out polishing time.

DESCRIPTION OF THE PREFERRED EMBODIMENTS

To assist understanding of the present invention, the existing techniques will be described with reference to the drawings.

Figure 1:
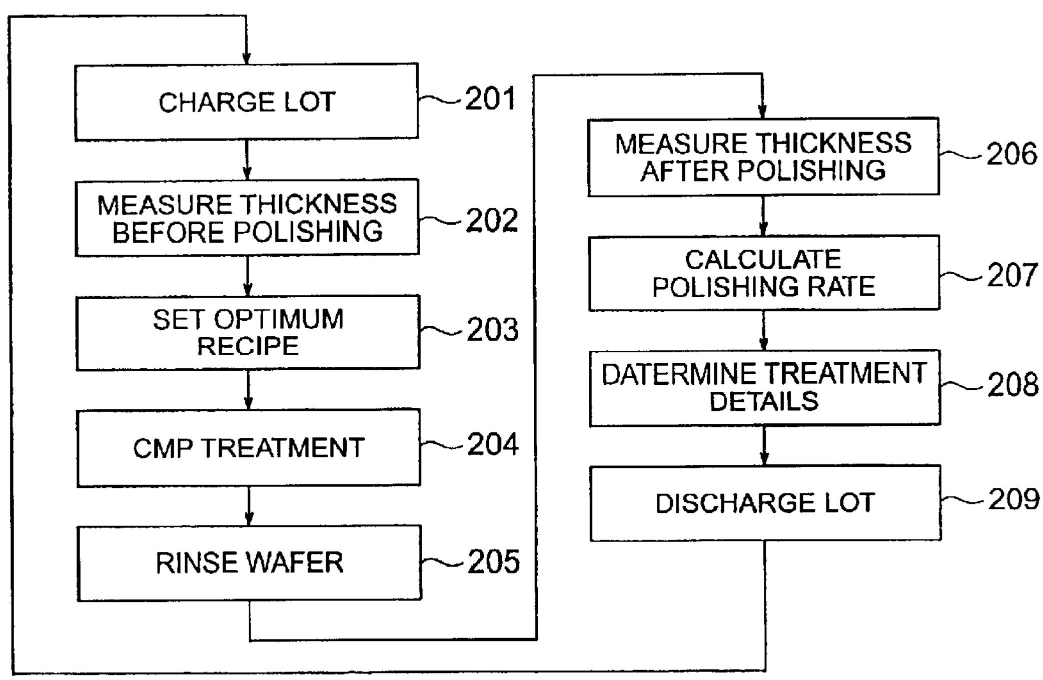
FIG. 1 is a flow chart for illustrating an existing polishing method.

The technique disclosed in Japanese Patent Publication No. 3077656 will be described with reference to the flowchart shown in FIG. 1. First, a lot coming from the preceding process is charged into a thickness measuring unit (step 201). The thickness measuring unit performs measurement of thickness before polishing of the lot (step 202). Then, the lot is taken out from the thickness measuring unit and subjected to a CMP treatment. The recipe adopted for the CMP treatment comprises a recipe fixing unit determining a recipe on the basis of the type of the film and the required amount of polishing, and a recipe variable unit which determine the same from the relationship between the polishing time and the amount of polishing for previous batches. Presence of the recipe variable unit ensures renewal to an optimum recipe reflecting the state of the apparatus. The process recipe information corrected by adding the recipe change portion to the recipe fixing portion is set as the optimum recipe (step 203), and the CMP treatment is started (step 204). After the completion of polishing, a wafer rinsing is conducted (step 205), followed by measurement of thickness after polishing (step 206). The latest polishing rate is calculated from the measurement result (step 207), and the calculated result is stored in a variable parameter table. The resultant latest polishing rate is used when determining an optimum recipe for the next lot. Then, it is determined whether or not the thickness after polishing is within a reference range (step 208), and the history resulting from this determination is stored in a prescribed storage unit. Upon the completion of all the treatments of the CMP process, the lot is discharged (step 209), and sent to the next process.

Methods for determining a polishing time and polishing conditions for the subsequent runs on the basis of data regarding the polishing time and the amount of polishing upon chemico-mechanically polishing a wafer are disclosed in some other publications.

Japanese Unexamined Patent Publication No. 10-106984 discloses a method of calculating an optimum polishing time from the polishing time, the target thickness value and the thickness before polishing and applying the same to the subsequent runs of polishing. Japanese Unexamined Patent Publication No. 10-98016 discloses a method of detecting the state of polishing by measuring the thickness after polishing, and controlling polishing conditions with reference to the detection result and a reference thickness.

Japanese Unexamined Patent Publication No. 8-17768 discloses a method of measuring the thickness after polishing of a stepped wafer, and setting a polishing time for the next run of polishing in response to the result of measurement.

However, in a method of determining a polishing time and polishing conditions for subsequent runs on the basis of data regarding the polishing time and the amount of polishing for the preceding run of polishing as in the above-mentioned conventional art, several batches are usually required before grasping an optimum polishing time giving a target thickness value. The reason has not as yet been clearly known. The present inventor carried out many experiments, and elucidated that occurrence of surface irregularities on the surface of the film to be polished was the cause. This point will now be described with reference to the drawings.

Figure 2A:
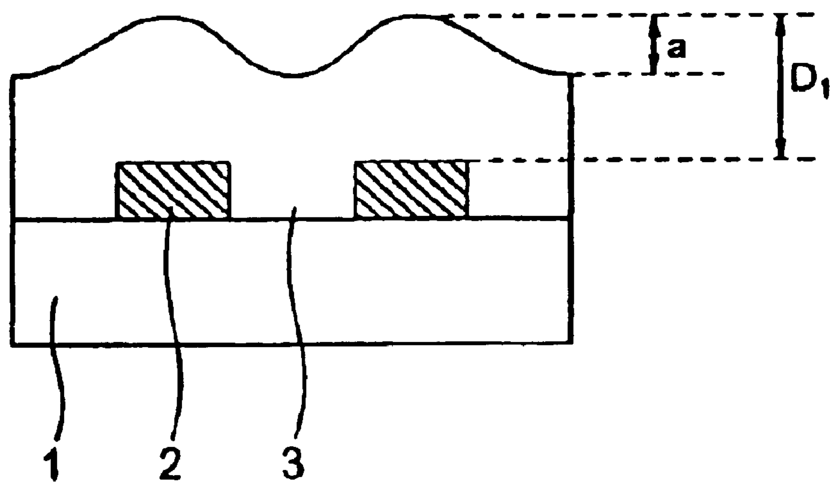
FIGS. 2A and 2B are schematic cross sectional views for illustrating an existing polishing method.
Figure 2B:
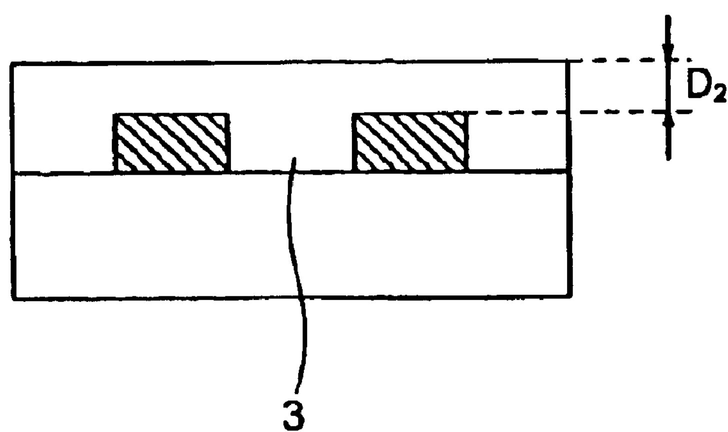

FIGS. 2A and 2B are process views for describing an existing chemico-mechanical polishing process. The object to be CMP-treated in this case is, as shown in FIG. 2A, a wafer in which aluminum wiring 2 and a silicon oxide film 3 are laminated on an insulating layer 1 serving as the substrate. Reflecting the shape of the aluminum 2, surface irregularities having a difference in height a are produced on the surface of the silicon oxide film 3. In this configuration, the distance D1 between the surface of the aluminum wiring 2 and the surface of the silicon oxide film 3 is referred to as the initial thickness. Then, the silicon oxide film 3 surface is polished by CMP to finally achieve a target thickness D2 as shown in FIG. 2B. In the process from FIGS. 2A to 2B, in the former half of polishing, the surface irregularities of the silicon oxide film 3 leads to a substantially small amount of polishing and a rapid decrease in the thickness. In the latter half, on the other hand, the surface irregularities of the silicon oxide film 3 disappear into a flat surface of the film, and this results in a substantially larger amount of polishing of the silicon oxide film 3 which results in a lower rate of polishing.

As described above, the existing art has the problems as described above under the heading of the Background of the Invention.

The present invention will now be described.

In the invention, polishing is divided into two, comprising a former half and a latter half, to obtain accurate information rapidly about the polishing time, taking into account the middle state of polishing. It is therefore possible to accurately estimate a polishing time even for an object to be polished of which the surface condition or the material varies during the process of polishing, and by using the thus estimated polishing time, a target thickness value can be certainly achieved. It is furthermore possible to reduce the time required before grasping an optimum polishing time, thus permitting improvement of productivity.

The preceding wafer as used in the present invention means a wafer polished at the top of the other product wafers to acquire polishing data. The preceding wafer itself may be used as a product by re-polishing or the like.

In this embodiment, a plurality of wafers each having a film formed on the surface thereof are made up into a lot, and wafers made up into a lot are chemico-mechanically polished one by one to have a target thickness value. First, the surface film of the preceding wafer selected from a lot is subjected to a CMP treatment in the following procedure to determine a CMP treatment time.

Figure 3A:
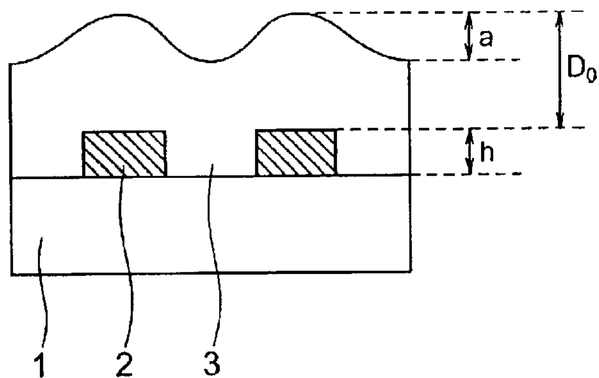
FIGS. 3A to 3D are schematic cross sectional views for illustrating a polishing method according to the present invention.

FIGS. 3A to 3D are process views including film forming and the CMP process. First, aluminum wiring 2 patterned into a prescribed shape is formed on the insulating film 1. With this as a primer layer, a silicon oxide film 3 is formed thereon by the plasma CVD process. FIG. 3A illustrates this state. Reflecting height h of the aluminum wiring 2, surface irregularities of a height a are produced on the surface of the silicon oxide film 3. The distance D0 between the surface of the aluminum wiring 2 and the surface of the silicon oxide film 3 is used as an initial thickness of the silicon oxide film 3.

Figure 3B:
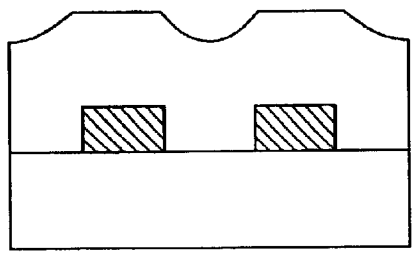

Then, the surface of the silicon oxide film 3 is polished by CMP into the state shown in FIG. 3B. In the course from the state shown in FIG. 3A to the state of FIG. 3B, the substantial amount of polishing is small and the thickness is reduced rapidly because of the surface irregularities of the silicon oxide film 3.

Figure 3C:
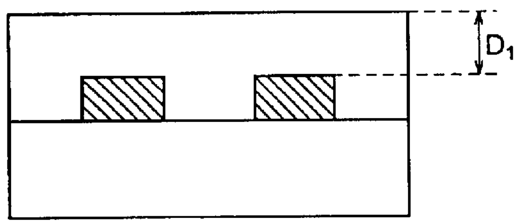

When continuing CMP thereafter, the state shown in FIG. 3C is reached. At this point in time, irregular portions of the silicon oxide film 3 disappear, and the surface is flat. In the subsequent polishing, therefore, the substantial amount of polishing of the silicon oxide film 3 becomes larger, resulting in a slower progress of polishing. In this embodiment, CMP is once discontinued in a stage before the moment when the target thickness value D2 is reached. The thickness upon discontinuance of CMP is denoted as D1. The first run of CMP is thus completed.

Then, the polishing time of CMP for the second and subsequent runs is determined on the basis of this result. Since a time from FIGS. 3A to 3C is determined from the above-mentioned experiment, the time required for the subsequent course from FIGS. 3C to 3D is calculated, and the CMP polishing time is calculated by summing up these values of time.

Figure 3D:
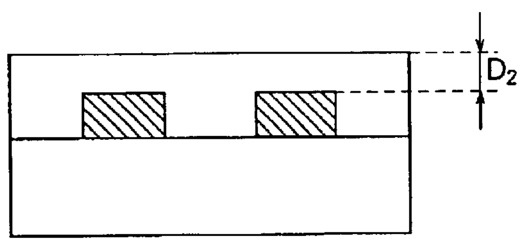

The time required from FIGS. 3C to 3D is calculated as follows. Prior to the CMP treatment of this embodiment, the polishing rate in the case where the silicon oxide film 3 formed on the flat substrate is CMP-treated under the same conditions as in the process shown in FIGS. 3A to 3C is previously measured. This value is denoted as v. Because the surface irregularities of the silicon oxide film 3 has already disappeared in the state from FIGS. 3C to 3D, the same polishing rate as that of the silicon oxide film 3 formed on a flat wafer is obtained. The time required for conducting polishing in the meantime can be estimated as (D1–D2)/v.

The polishing time T is calculated by adding the time t1 required for polishing the preceding wafer from the state shown in FIG. 3A to the state of FIG. 3C to this value. This value of T is adopted as the CMP treatment time for the subsequent runs. For the second and subsequent runs of polishing, the steps from FIGS. 3A to 3D are carried out.

Figure 13:
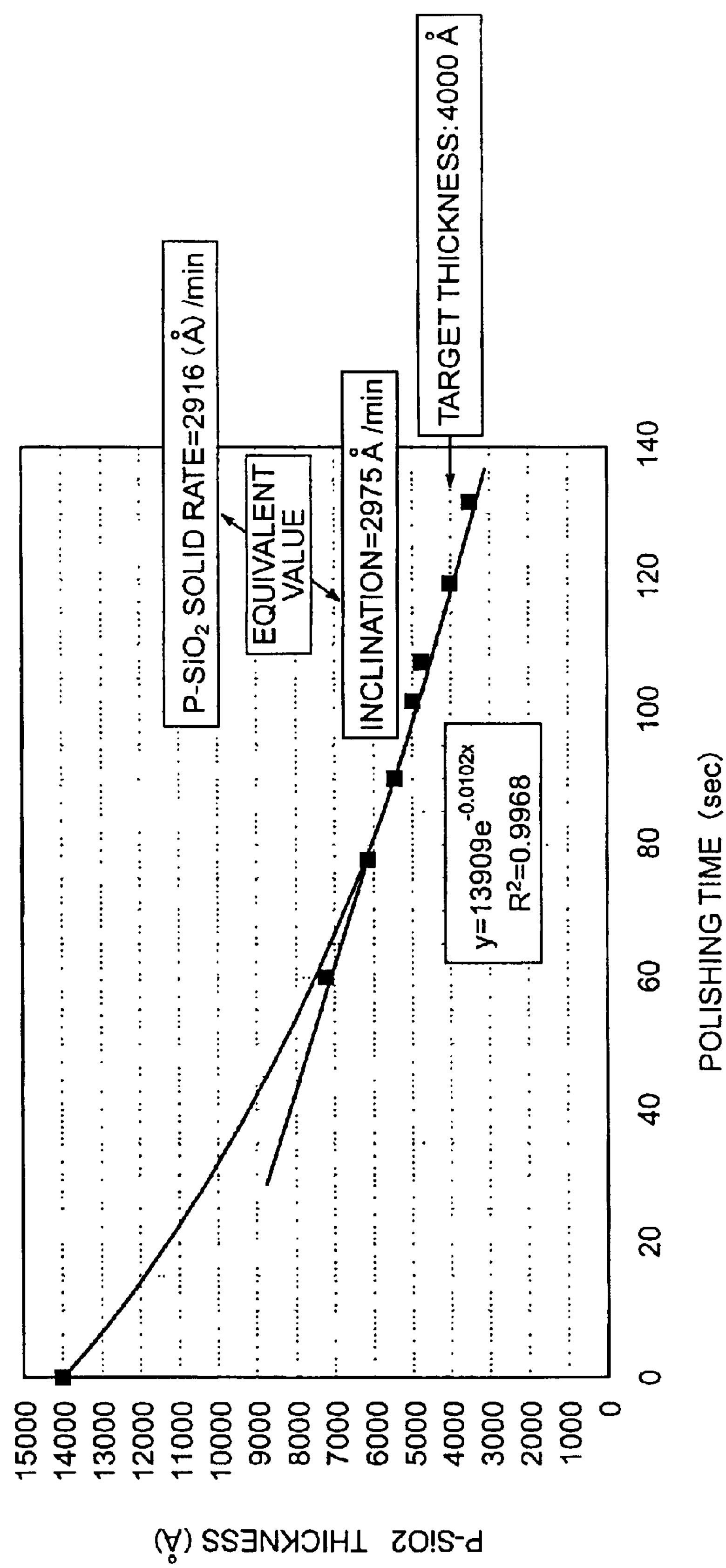
FIG. 13 is a line diagram showing a polishing profile of chemico-mechanical polishing.

In the aforementioned method, the polishing rate is calculated on the assumption that, after disappearance of the surface irregular portion of the silicon oxide film 3, the same polishing rate as for the silicon oxide film 3 formed on the flat substrate is available. This fact will be described on the basis of experimental data. FIG. 13 illustrates the relationship between the polishing time and the remaining thickness in a case where a silicon oxide film formed by the plasma CVD process is chemico-mechanically polished. An initial thickness of 14,000 Å (angstrom) and a target thickness of 4,000 Å are set. As is known from FIG. 13, the polishing rate is higher in the former half of polishing, whereas the polishing rate is rather constant in the latter half. Near the polishing end point, the polishing rate and the thickness is in a satisfactory linear relationship. The polishing rate derived from the inclination of the straight line was 2,975 Å/mm. On the other hand, when chemico-mechanically polishing a silicon oxide film formed on a flat substrate by the same film forming process (plasma CVD process), the polishing rate was 2,916 Å/mm. These polishing rates are almost uniform, and it was confirmed that the polishing rate in the latter half of polishing in the process shown in FIG. 3 was equal to the polishing rate of a film made of the same component materials formed on a flat substrate.

Figure 6:
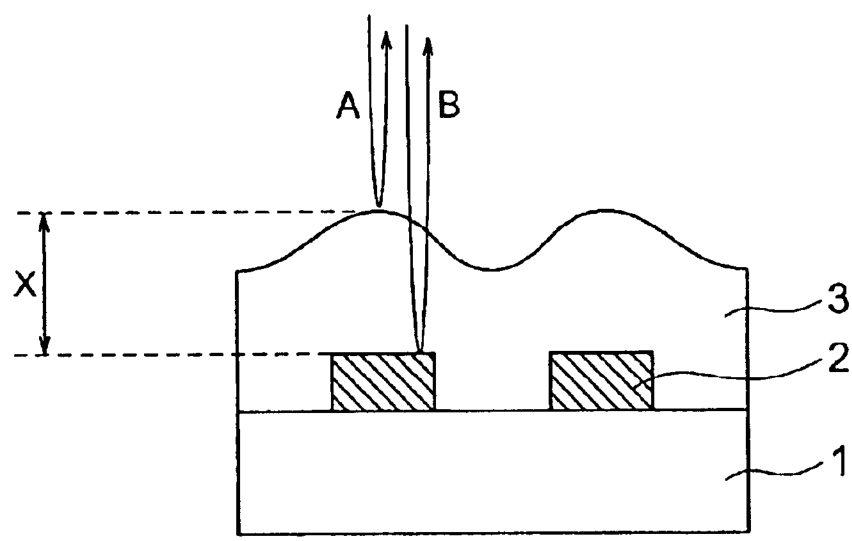
FIG. 6 is a schematic cross sectional view for illustrating a thickness measuring process in the polishing method according to the present invention.
Figure 7:
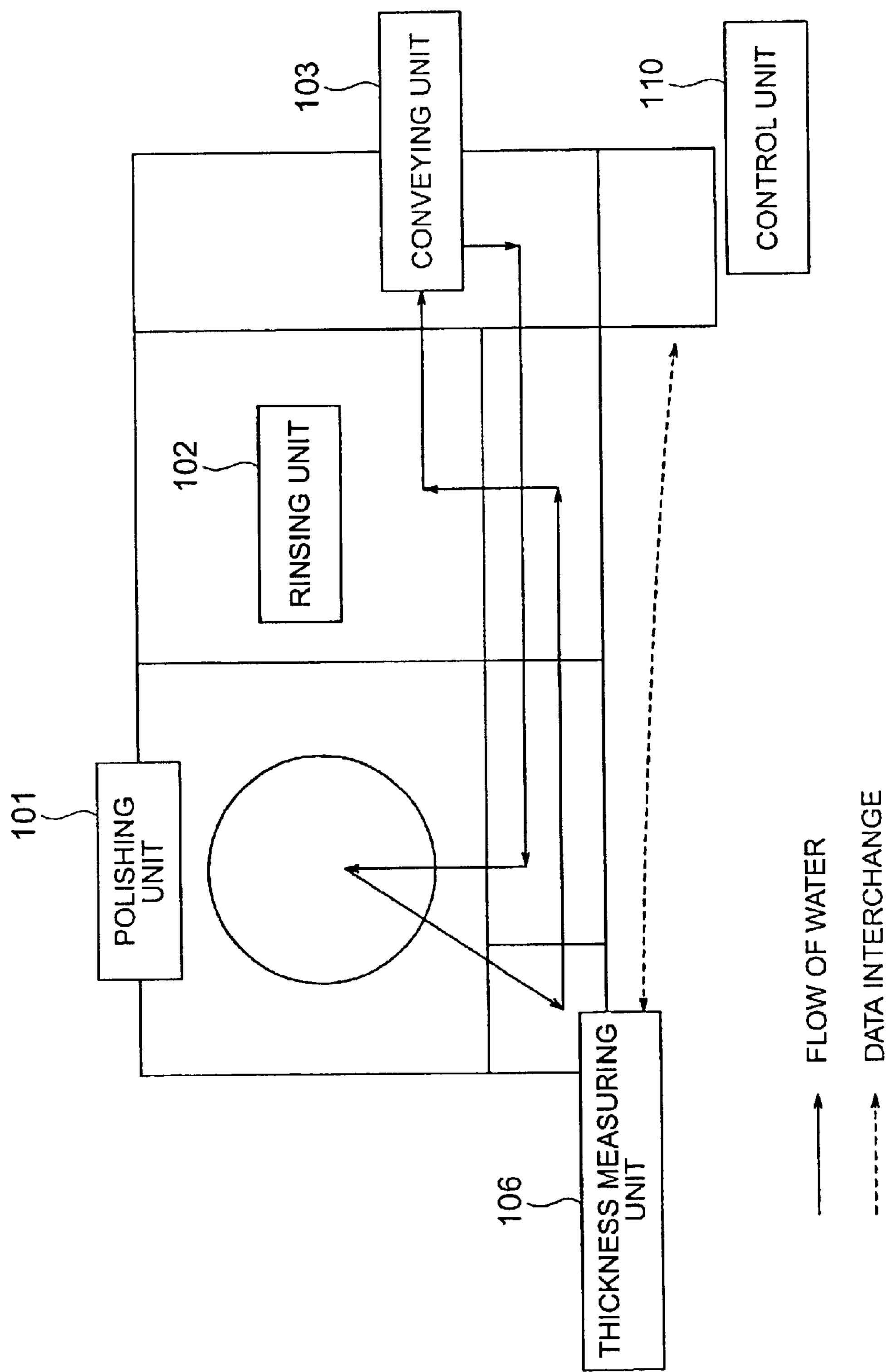
FIG. 7 is a block diagram showing a polishing apparatus according to the present invention.

A typical configuration of the polishing apparatus of the present invention will now be described. FIG. 7 illustrates a typical configuration of the apparatus of the invention. This apparatus comprises a polishing unit 101 which polishes a wafer; a thickness measuring unit 106 which measures the wafer thickness; a conveying unit 103 which conveys the wafer; a rinsing unit 102 which rinses the wafer; and a control unit 110 which controls the thickness. In this apparatus, after the wafer is polished by the polishing unit 101, the wafer is sent to the thickness measuring unit 106 in which the thickness is measured. Thereafter, the wafer is sent to the rinsing unit 102 for rinsing. The thickness is measured by means of an optical in-line thickness measuring instrument or the like. The optical in-line thickness measuring instrument performs measurement in accordance with the principle shown in FIG. 6. That is, light of a prescribed wavelength is irradiated onto an object to be measured, and reflected beams A and B are observed. Because the material physical properties of the silicon oxide film 3 are known, an optical path difference X of the reflected beams A and B is determined, thus permitting measurement of the thickness.

Figure 8:
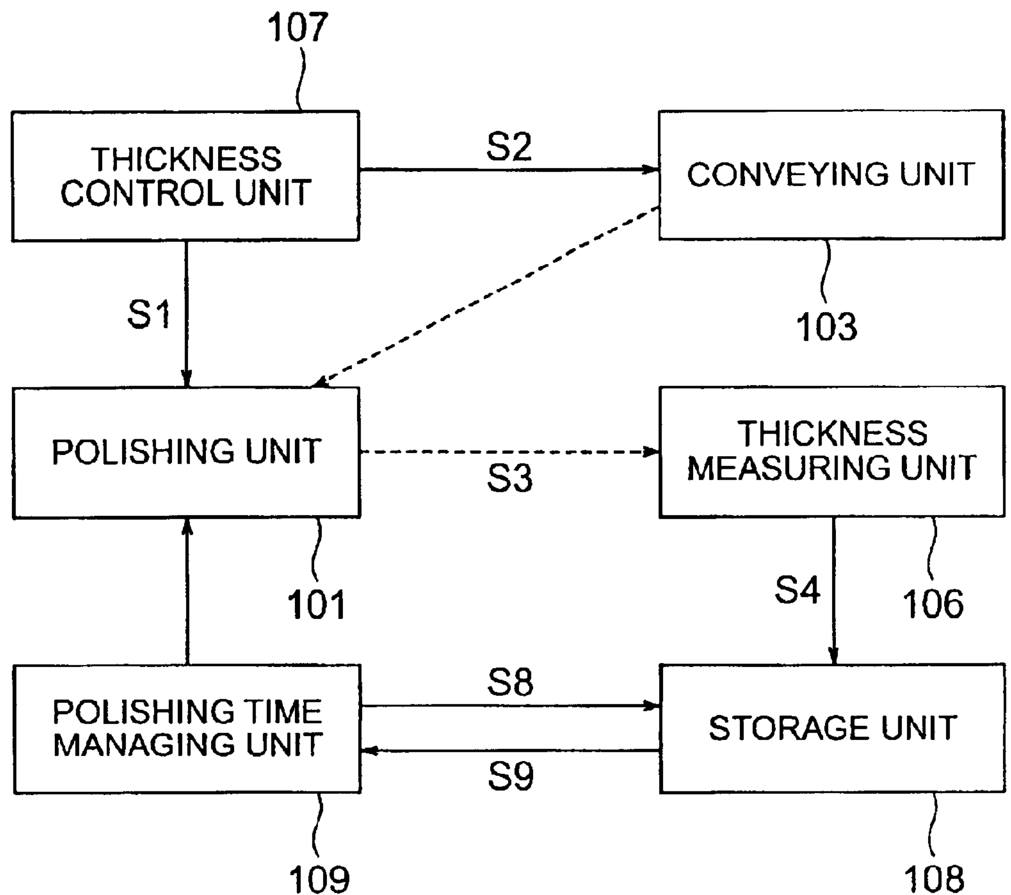
FIG. 8 is another block diagram showing a polishing apparatus according to the present invention.

FIG. 8 is a functional block diagram illustrating the apparatus of the present invention in terms of functions. In FIG. 8, the solid line represents exchange of data, and the dotted line shows movement of the wafer. Data exchange and wafer movement in the apparatus will be described with reference to FIG. 8.

First, the thickness control unit 107 sets a polishing time so that the residual film thickness is thicker than the target thickness, and communicates the same to the polishing unit 101 and the conveying unit 103 (S1 and S7). The polishing unit 101 performs chemico-mechanical polishing for the communicated polishing time. Upon the completion of polishing, the conveying unit 103 conveys the wafer placed on the polishing unit 101 to the thickness measuring unit 106 (S3). The film thickness measuring unit measures the thickness of the remaining film of the wafer. The measured thickness is denoted as D1, and the thickness D1 and the polishing time t1 required before reaching the thickness D1 from the initial thickness are stored in the storage unit 108 (S4).

The polishing time managing unit 109 reads out D1, D2, t1 and the polishing rate v of the above-mentioned film material formed on a flat substrate, stored previously in the storage unit 108 (S8 and 9), and calculates T as defined by the following formula (I):

$$T=(D1-D2)/v+t1 \tag{I}$$

where, D1 represents the thickness in a stage in which polishing is discontinued; D2, a target thickness; and t1, the time required for reaching the thickness D1 from the initial thickness. A polishing time for the wafer to be polished is determined with reference to this value. As the polishing time, the above-mentioned T may be used as it is, or a polishing time may be determined by appropriately correcting T when the initial thickness differs between the preceding wafer and the wafer to be polished. When correcting T, for example, the following formula (II) may be used:

$$T'=T+d/v \tag{II}$$

where, d represents the difference in initial thickness between the preceding wafer and the wafer to be polished.

Figure 4A:
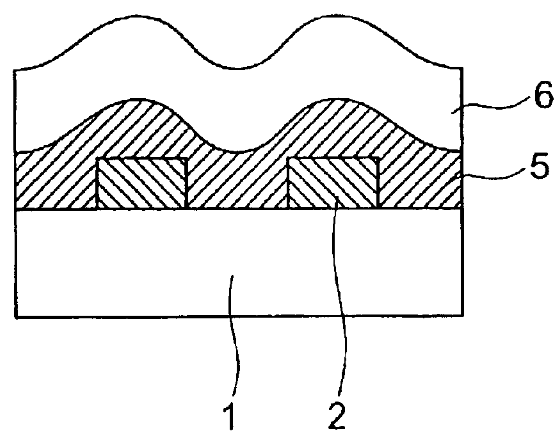
FIGS. 4A to 4C are schematic cross sectional views for illustrating the polishing method according to the present invention.
Figure 4B:
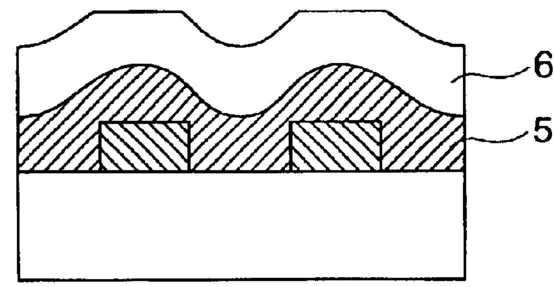
Figure 4C:
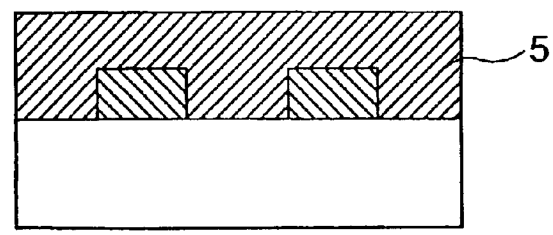
Figure 5:
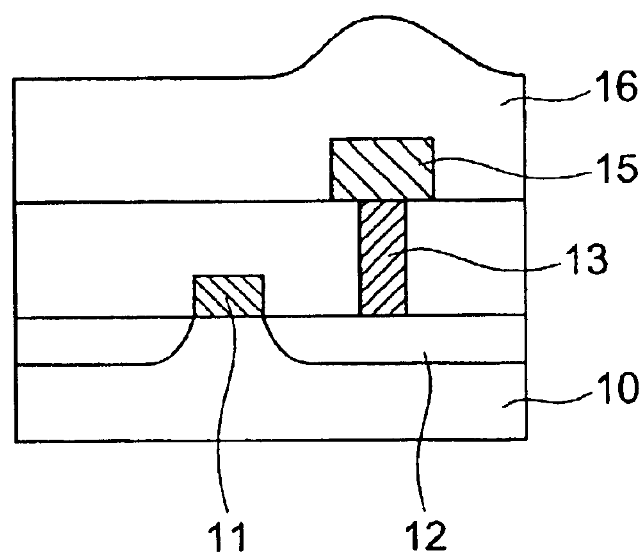
FIG. 5 is a schematic cross sectional view showing a device to which the polishing method according to the invention is applicable.

The present invention is effectively applicable to an object of polishing of which the surface condition or the material properties vary during the polishing process. The invention is effective, for example, for a configuration in which, in addition to irregularities on the substrate surface, the interlayer insulating layer comprises a lamination of a first silicon oxide film 5 and a second silicon oxide film 6, as shown in FIGS. 4A to 4C. The "film provided on the surface of a wafer having irregularities" as used in the present invention include various forms. FIG. 5 illustrates an example thereof. FIG. 5 schematically shows a construction of a DRAM: a transistor comprising a gate electrode 11 and a diffusion layer 12 is formed on a silicon substrate 10, and a capacitor 15 is formed thereon via a contact plug 13. The polishing method of the invention is suitably applicable to the flattening step of an insulating film 16 formed on this capacitor 15. The polishing method of the invention is applicable also to the flattening step after embedding a prescribed film material into a trench in an STI (shallow trench isolation) forming process.

First Embodiment

Figure 12:
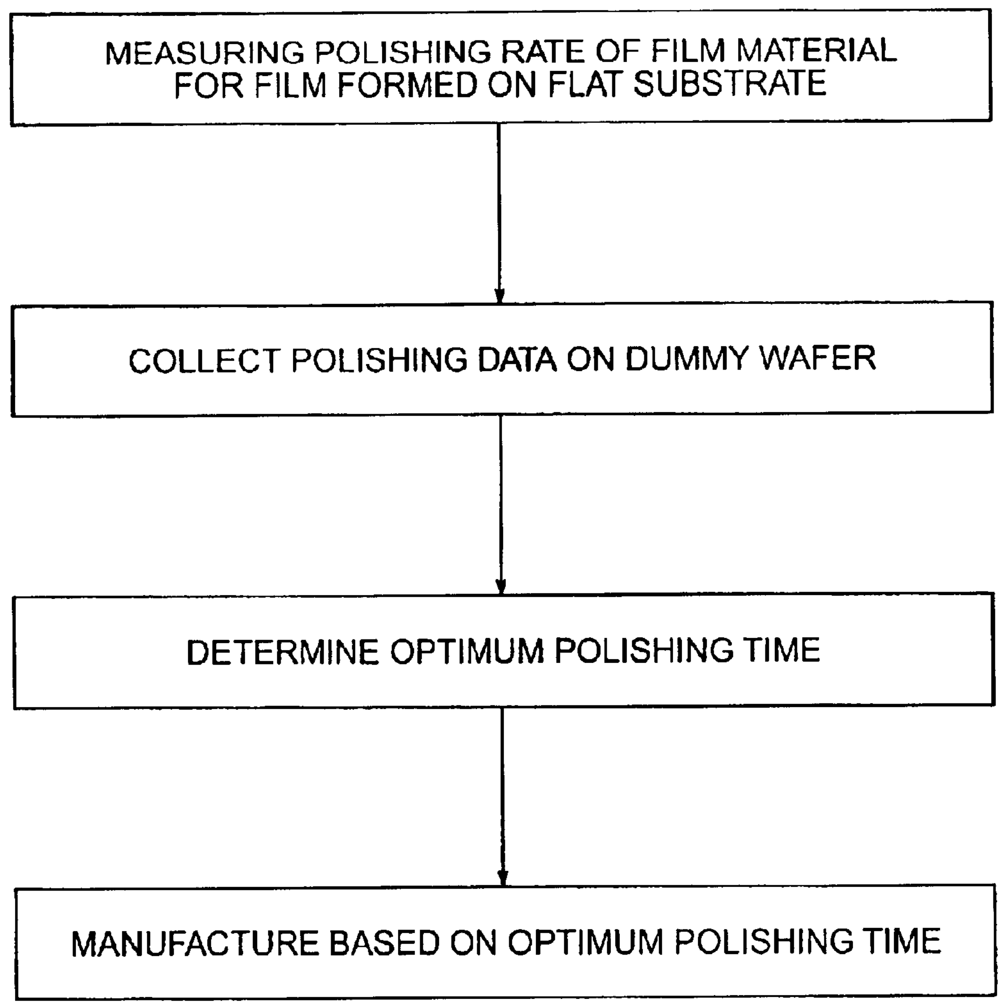
FIG. 12 is a flow chart for illustrating a polishing method according to the present invention.

The flow of chemico-mechanical polishing in this embodiment is illustrated in FIG. 12. The polishing rate of the film material formed on the flat substrate is first measured, and then, polishing data obtained by using the preceding wafer are collected. An optimum polishing time is determined from these data, and the actual wafer to be polished is polished on the basis of the thus determined optimum polishing time.

(i) Object to be Polished

The wafer to be polished in this embodiment has a cross-sectional structure as shown in FIG. 3A. This wafer is prepared by forming an aluminum wiring 2 (thickness: about 5,000 Å) on a silicon wafer, and then forming a silicon oxide film 3 (thickness at flat portion: about 14,000 Å) by the plasma CVD process. In this embodiment, a plurality of wafers (a lot) in this stage were provided, and every four wafers were chemico-mechanically published. The target thickness value D2 was 5,000 Å.

(ii) Determination of Optimum Polishing Time

A preliminary experiment was carried out. A film was formed on a flat surface of a silicon substrate under the same film forming conditions as those of the silicon oxide film 3 of the wafer shown in FIG. 3A, and the polishing rate v of this film was measured. As a result, a polishing rate of 2,900 Å/min was obtained.

Then, optimization of the polishing time was performed for the manufacture of a preceding wafer. In polishing, a polishing apparatus of the configuration described with reference to FIG. 8 was employed. The optimization procedure will now be described.

The preceding wafer was first arranged on the polishing unit 101 to start polishing. The polishing time is adjusted so as to discontinue polishing at a timing when a thickness larger than the target thickness D2 remains. This adjustment may be based on a method permitting remaining of a film in excess by use of empirical values, or a method adjusting the same while measuring the thickness at an appropriate timing.

Then, the time t1 required before this stage is stored in the storage unit 108. The conveying unit 103 is requested to move the preceding wafer to the thickness measuring unit 106. Thickness of the preceding wafer is measured by the thickness measuring unit 106. The thus measured thickness is denoted as D1. The thickness D1 and the polishing time t1 required before reaching the thickness D1 are stored in the storage unit 108.

Then, the polishing rate v, the thickness D1, the target thickness D2, and the polishing time t1 are read out from the storage unit 108, and T defined by the following formula (I) is calculated.

$$T=(D1-D2)/v+t1 \tag{I}$$

This value is used as the polishing time for the subsequent runs of polishing.

(iii) Polishing of Wafer for Optimum Polishing Time

In the apparatus used in this embodiment, four wafers are simultaneously placed for film polishing. The above-mentioned determination of the optimum polishing time is therefore carried out for each wafer table. The state of polishing pad and the polishing rate differ between the wafer tables, it is recommendable to determine a polishing time for each wafer table.

Figure 9:
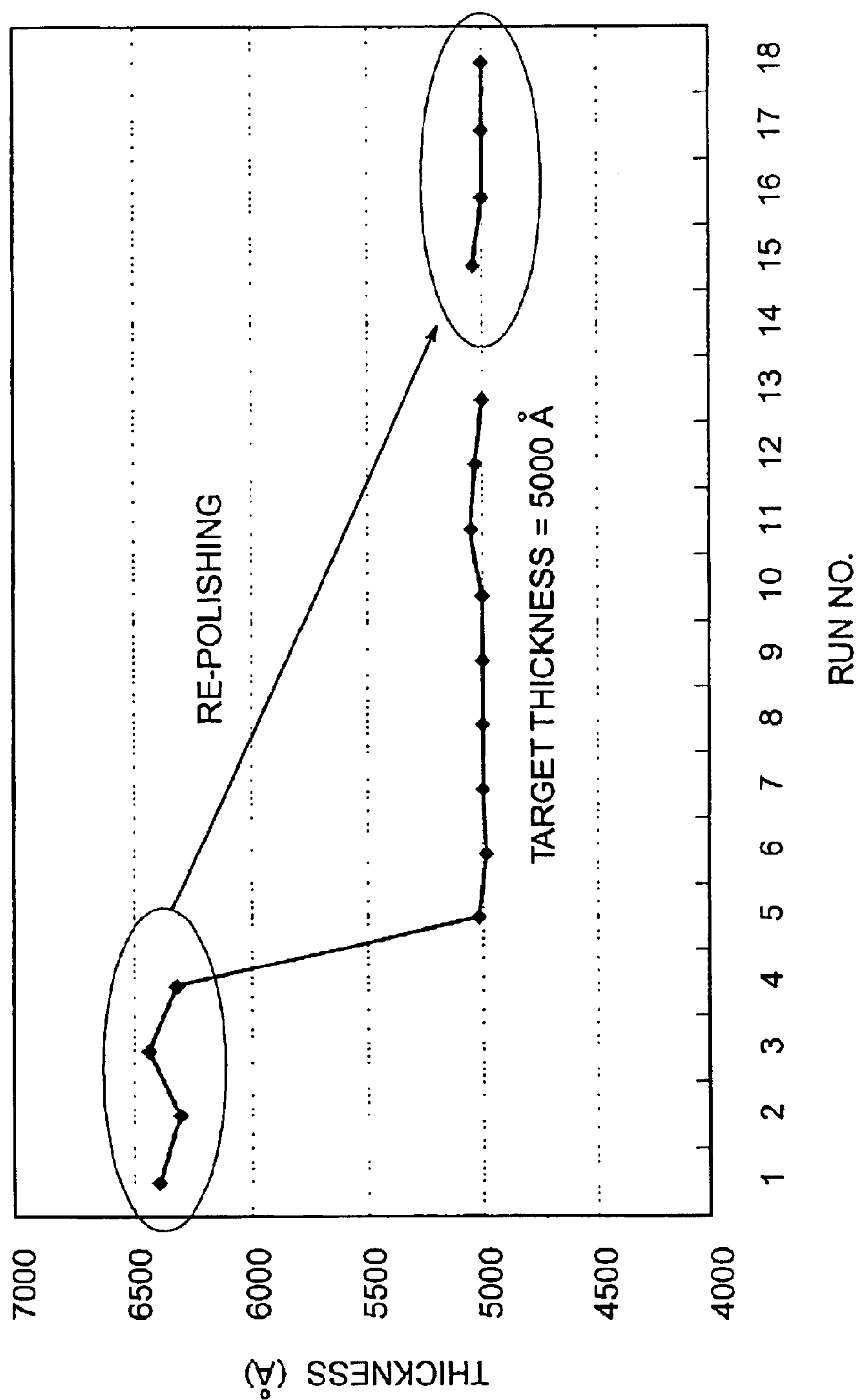
FIG. 9 is a line diagram showing the result of a first embodiment according to the present invention.

FIG. 9 illustrates the run No. on the abscissa, and the thickness after polishing on the ordinate. In FIG. 9, run Nos. 1 to 4 represent polishing result of the preceding wafer. The value of T is determined from the result of run No. 1 as follows.

$$T=(D1-D2)/v+t1 \quad \text{(I)}$$

The following values are incorporated into this formula (I): D2=5,000 Å; D1=6,400 Å, v=2,900 Å/min; and t1=2 min. This leads to T=2.48 min. For run Nos. 5, 9, 13, . . . , chemico-mechanical polishing was applied with this T as the polishing time. As a result, the remaining film thickness was 5,000 Å for run Nos. 5 and subsequent runs, values agreeing with the target value.

Similarly, chemico-mechanical polishing was carried out by use of the polishing time determined on the basis of run Nos. 2, 3 and 4. As shown in FIG. 9, a thickness satisfying the target was obtained in all cases.

In this example, even the preceding run Nos. 1 to 4 for determining a polishing time are reused as products by chemico-mechanically polishing them again. In this case, a polishing time t2 as defined by the following formula was adopted:

$$t2=(D1-D2)/v$$

In FIG. 9, run Nos. 15 to 18 represent wafers obtained through re-polishing. The remaining film thickness was 5,000 Å in all cases, satisfying the target value.

COMPARATIVE EXAMPLE

In this Comparative Example, a method of determining a polishing time and polishing conditions for the next and subsequent runs on the basis of polishing time and polishing amount data obtained by chemico-mechanically polishing a wafer was adopted. As in the first embodiment, the polishing was calculated by use of a preceding wafer. A calculation formula different from that in the first embodiment was used as follows:

$$T=(D1-D2)/v'+t1D1$$

where, D1 represents the thickness in the stage in which polishing is discontinued; D2, a target thickness; t1, a time required from the initial thickness to the thickness D1; and v', data of polishing rate of a film formed on the aluminum wiring pattern. In this respect, the formula is different from the formula (I) used in the first embodiment using the polishing rate of the film formed on a flat substrate.

Figure 10:
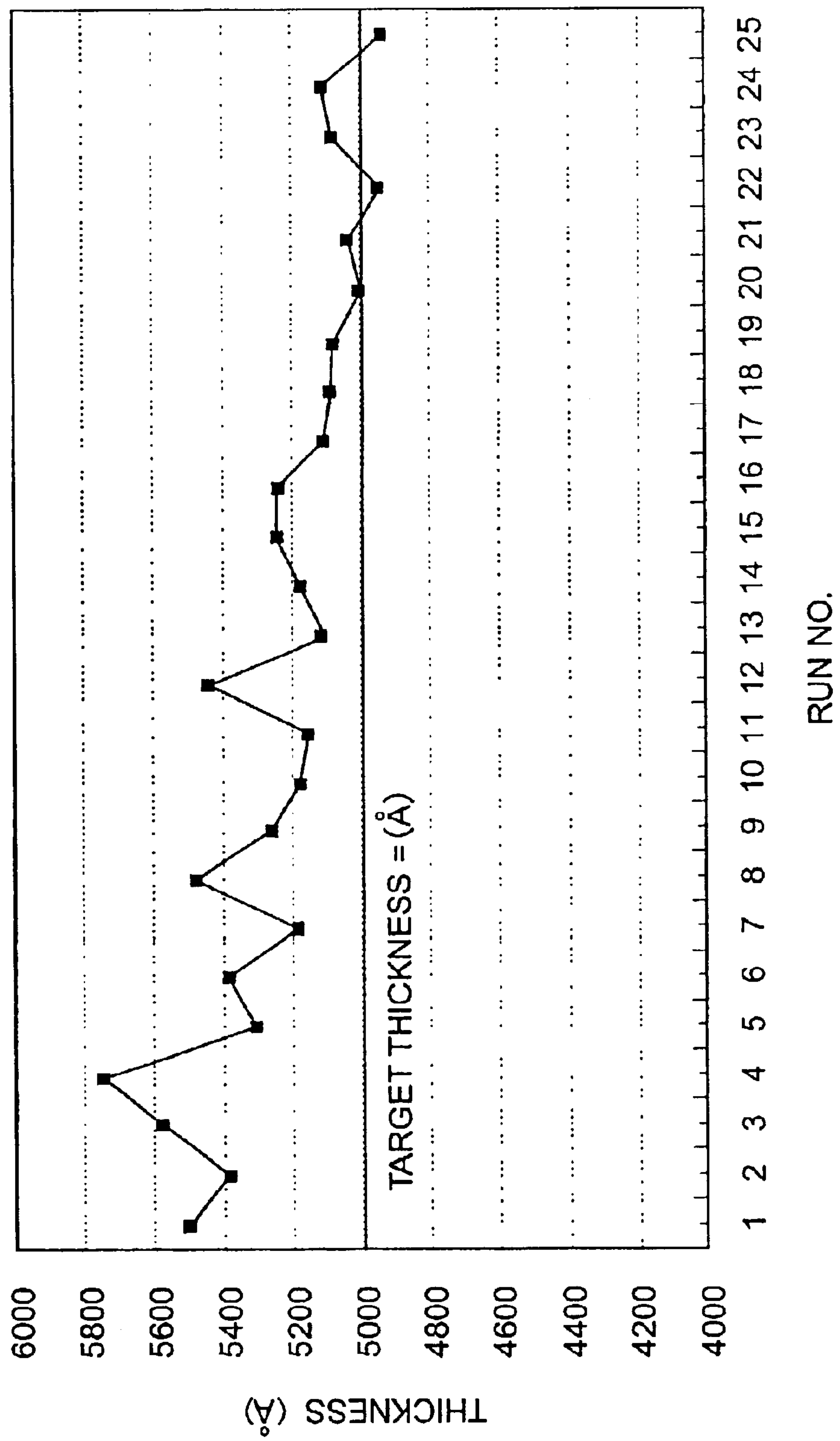
FIG. 10 is a line diagram showing the result of a comparative the first embodiment.

The polishing unit of the polishing apparatus used in this Comparative Example is the same as that used in the first embodiment. The wafer to be polished is the same as in the first embodiment, and every four wafers were chemico-mechanically polished. The target thickness value was 5,000 Å. The result of polishing is illustrated in FIG. 10. In FIG. 10, run Nos. 1 to 4 represent polishing result of the preceding wafer in all cases.

In FIG. 10, the run No. 1 wafer was chemico-mechanically polished, and then, the run No. 5 wafer was polished for a polishing time calculated on the basis of the polishing rate obtained in run No. 1 polishing. Subsequently, a polishing time for the next run of polishing was calculated by using polishing data of the preceding run No., in the same manner as described above to carry out chemico-mechanical polishing for run Nos. 9, 13, . . . . Similarly, the subsequent run No. wafers were polished on the basis of run Nos. 2, 3 and 4.

The result of polishing obtained by this method is illustrated in FIG. 10. It is difficult to achieve a target thickness while keeping a satisfactory controllability. The observed value gradually approaches the target thickness along with the progress of run Nos. However, many batches were required before achievement of the target thickness.

Second Embodiment

Figure 11:
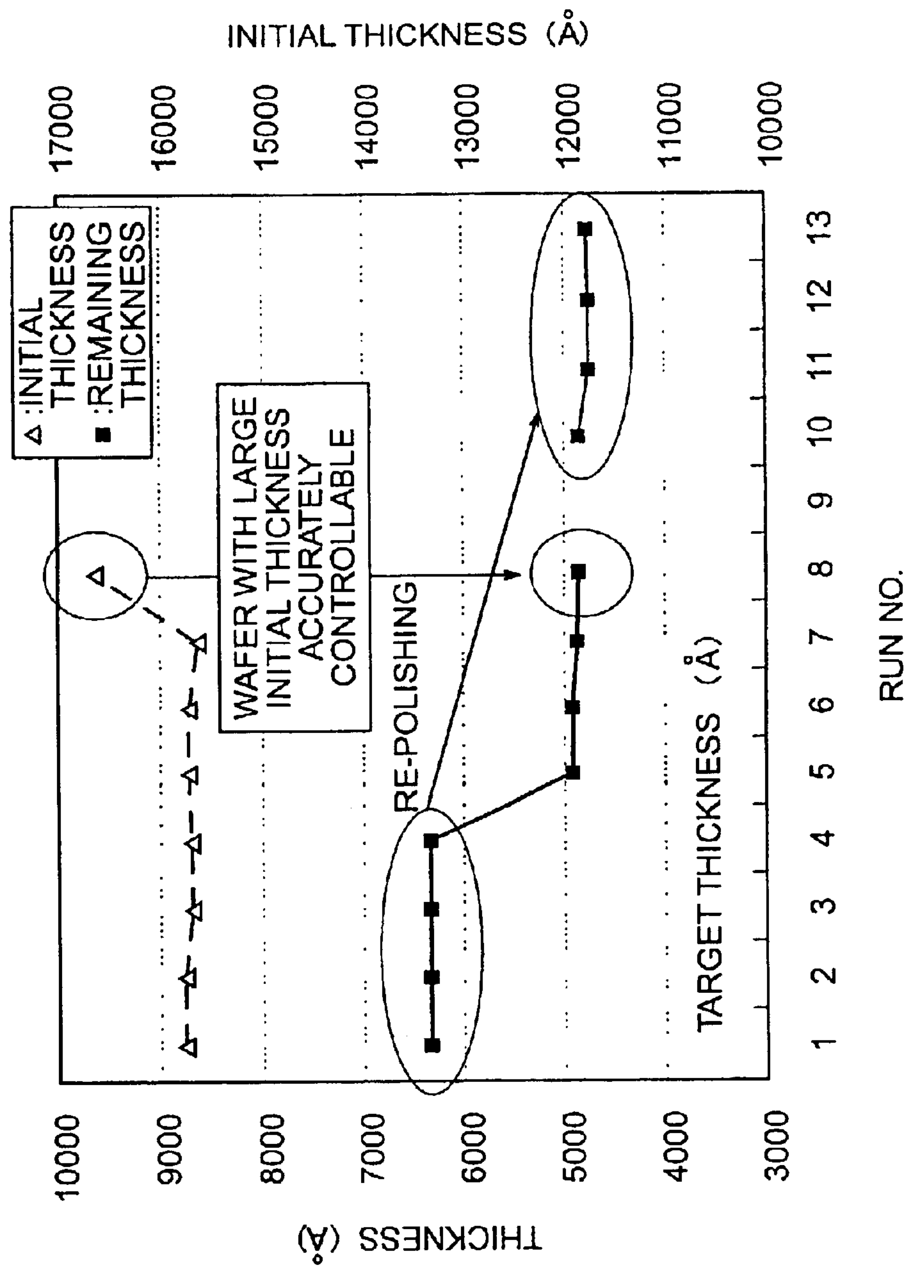
FIG. 11 is a line diagram showing the result of a second embodiment according to the present invention.

In this Example, wafers having a different initial thickness were inserted in the middle of the batch treatment of wafer polishing. The result of polishing is illustrated in FIG. 11. While the case of treatment of a plurality of wafer having the same initial thickness was presented in the first embodiment, in this example, wafers of a different initial thickness were treated in the middle. A different polishing time was therefore set for these wafers. This polishing time was set by using T' defined by the following formula (II) as the holding time:

$$T'=T+d/v \quad \text{(II)}$$

where, the different in initial thickness between the preceding wafer and the wafer to be polished is denoted as d. In this Example, the preceding wafer had an initial thickness of about 8,700 Å, and the run No. 8 wafer had an initial thickness of about 9,600 Å. A polishing time T' suitable for run No. 8 is available by adding a value obtained by dividing the thickness difference of 900 Å by the flat portion polishing rate v determined in a preliminary experiment to the polishing time T for the other run Nos.

Chemico-mechanical polishing was carried out for the thus obtained polishing time T'. As a result, even for run No. 8, the thickness of the remaining film was 5,000 Å, a value agreeing with the target value.

While this invention has thus far been described in conjunction with a few preferred embodiments thereof, it will now be readily possible for those skilled in the art to put this invention into practice in various other manners.

What is claimed is:

1. A polishing method of chemico-mechanically polishing a film formed on a wafer with a surface having surface irregularities to a target thickness, said method comprising the steps of:

determining a predicted required time for a former half of polishing by use of polishing data acquired upon polishing the preceding wafer selected from a same lot as a wafer to be polished and of a type similar to that of the wafer to be polished, the former half of polishing being for polishing the film until the surface irregularities disappear and are changed into a flat surface portion;

determining a predicted required time for a latter half of polishing by use of a polishing rate of the component materials of said film formed on a flat substrate, the latter half of polishing being for polishing the flat surface portion of the film;

using a value obtained by summing up these predicted required times; and chemico-mechanically polishing a wafer to be polished.

2. A polishing method of chemico-mechanically polishing a film formed on a surface of a wafer having surface irregularities to a target thickness, said method comprising the steps of:

acquiring a polishing rate v of component materials of said film formed on a flat substrate;

chemico-mechanically polishing a preceding wafer selected from a same lot as a wafer to be polished and of the same type as the wafer to be polished, discontinuing polishing in a stage prior to reaching said target thickness so that the surface irregularities disappear, and measuring the film thickness in this stage;

calculating T as defined by the following formula (I):

$$T=(D1-D2)/V+t1 \quad \text{(I)}$$

where, D1 represents the film thickness upon discontinuing polishing; D2 represents the target film thickness; and tl represents the time required from initial thickness to the thickness D1; and chemico-mechanically polishing the wafer to be polished, using a value obtained with reference to T as the polishing time.

3. The polishing method according to claim 2, wherein, upon chemico-mechanically polishing the wafer to be polished, T' defined by the following formula (II) is used as the polishing time:

$$T'=T+d/v \quad \text{(II)}$$

where, the difference in the initial thickness between said preceding wafer and said wafer to be polished is represented by d.

4. The polishing method according to claim 2, wherein, for said preceding wafer of the target film thickness D2, said method further comprises a step of performing chemico-mechanical polishing with t2 defined by the following formula as the polishing time:

$$t2=(D1-D2)/v$$

* * * * *

UNITED STATES PATENT AND TRADEMARK OFFICE

CERTIFICATE OF CORRECTION

PATENT NO. : 6,905,957 B2
DATED : June 14, 2005
INVENTOR(S) : Shinichiro Kakita

It is certified that error appears in the above-identified patent and that said Letters Patent is hereby corrected as shown below:

Title page,
Item [73], Assignee, should read -- NEC Electronics Corporation, Tokyo, Japan --.

Signed and Sealed this

First Day of November, 2005

JON W. DUDAS
*Director of the United States Patent and Trademark Office*